(12) United States Patent
Sokolov et al.

(10) Patent No.: US 8,228,701 B2
(45) Date of Patent: Jul. 24, 2012

(54) SELECTIVE ACTIVATION OF PROGRAMMING SCHEMES IN ANALOG MEMORY CELL ARRAYS

(75) Inventors: Dotan Sokolov, Ra'anana (IL); Naftali Sommer, Rishon Lezion (IL); Uri Perlmutter, Ra'anana (IL); Ofir Shalvi, Ra'anana (IL)

(73) Assignee: Apple Inc., Cupertino, CA (US)

( * ) Notice: Subject to any disclaimer, the term of this patent is extended or adjusted under 35 U.S.C. 154(b) by 277 days.

(21) Appl. No.: 12/714,501

(22) Filed: Feb. 28, 2010

(65) Prior Publication Data

US 2010/0220509 A1    Sep. 2, 2010

Related U.S. Application Data

(60) Provisional application No. 61/156,520, filed on Mar. 1, 2009.

(51) Int. Cl.
*G11C 27/00* (2006.01)
(52) U.S. Cl. ............................ 365/45; 365/185.03
(58) Field of Classification Search ............ 365/45, 365/185.03, 189.16
See application file for complete search history.

(56) References Cited

U.S. PATENT DOCUMENTS

| | | |
|---|---|---|
| 3,668,631 A | 6/1972 | Griffith et al. |
| 3,668,632 A | 6/1972 | Oldham |
| 4,058,851 A | 11/1977 | Scheuneman |
| 4,112,502 A | 9/1978 | Scheuneman |
| 4,394,763 A | 7/1983 | Nagano et al. |
| 4,413,339 A | 11/1983 | Riggle et al. |
| 4,556,961 A | 12/1985 | Iwahashi et al. |
| 4,558,431 A | 12/1985 | Satoh |
| 4,608,687 A | 8/1986 | Dutton |
| 4,654,847 A | 3/1987 | Dutton |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Mehrotta et al. |
| 5,077,722 A | 12/1991 | Geist et al. |

(Continued)

FOREIGN PATENT DOCUMENTS

EP    0783754 B1    7/1997

(Continued)

OTHER PUBLICATIONS

Wei, L., "Trellis-Coded Modulation With Multidimensional Constellations", IEEE Transactions on Information Theory, vol. IT-33, No. 4, pp. 483-501, Jul. 1987.

(Continued)

*Primary Examiner* — Vu Le
(74) *Attorney, Agent, or Firm* — Meyertons, Hood, Kivlin, Kowert & Goetzel, P.C.

(57) ABSTRACT

A method for data storage includes defining a first programming scheme that programs a group of analog memory cells while reducing interference caused by at least one memory cell that neighbors the group, and a second programming scheme that programs the group of the analog memory cells and does not reduce all of the interference reduced by the first programming scheme. One of the first and second programming schemes is selected based on a criterion defined with respect to the analog memory cells. Data is stored in the group of the analog memory cells using the selected programming scheme.

35 Claims, 2 Drawing Sheets

U.S. PATENT DOCUMENTS

| | | |
|---|---|---|
| 5,126,808 A | 6/1992 | Montalvo et al. |
| 5,163,021 A | 11/1992 | Mehrotra et al. |
| 5,172,338 A | 12/1992 | Mehrotta et al. |
| 5,182,558 A | 1/1993 | Mayo |
| 5,182,752 A | 1/1993 | DeRoo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Wells et al. |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,533,190 A | 7/1996 | Binford et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koning |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,314,044 B1 | 11/2001 | Sasaki et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yong et al. |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,480,948 B1 | 11/2002 | Virajpet et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 | 4/2003 | Pekny et al. |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzales et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 | 1/2004 | Ishii et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,732,250 B2 | 5/2004 | Durrant |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,804,805 B2 | 10/2004 | Rub |
| 6,807,095 B2 | 10/2004 | Chen et al. |
| 6,807,101 B2 | 10/2004 | Ooishi et al. |
| 6,809,964 B2 | 10/2004 | Moschopoulos et al. |
| 6,819,592 B2 | 11/2004 | Noguchi et al. |
| 6,829,167 B2 | 12/2004 | Tu et al. |
| 6,845,052 B1 | 1/2005 | Ho et al. |
| 6,851,018 B2 | 2/2005 | Wyatt et al. |

| | | |
|---|---|---|
| 6,851,081 B2 | 2/2005 | Yamamoto |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,870,773 B2 | 3/2005 | Noguchi et al. |
| 6,873,552 B2 | 3/2005 | Ishii et al. |
| 6,879,520 B2 | 4/2005 | Hosono et al. |
| 6,882,567 B1 | 4/2005 | Wong |
| 6,894,926 B2 | 5/2005 | Guterman et al. |
| 6,907,497 B2 | 6/2005 | Hosono et al. |
| 6,925,009 B2 | 8/2005 | Noguchi et al. |
| 6,930,925 B2 | 8/2005 | Guo et al. |
| 6,934,188 B2 | 8/2005 | Roohparvar |
| 6,937,511 B2 | 8/2005 | Hsu et al. |
| 6,958,938 B2 | 10/2005 | Noguchi et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 6,999,344 B2 | 2/2006 | Hosono et al. |
| 7,002,843 B2 | 2/2006 | Guterman et al. |
| 7,006,379 B2 | 2/2006 | Noguchi et al. |
| 7,012,835 B2 | 3/2006 | Gonzales et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,039,846 B2 | 5/2006 | Hewitt et al. |
| 7,042,766 B1 | 5/2006 | Wang et al. |
| 7,054,193 B1 | 5/2006 | Wong |
| 7,054,199 B2 | 5/2006 | Lee et al. |
| 7,057,958 B2 | 6/2006 | So et al. |
| 7,065,147 B2 | 6/2006 | Ophir et al. |
| 7,068,539 B2 | 6/2006 | Guterman et al. |
| 7,071,849 B2 | 7/2006 | Zhang |
| 7,072,222 B2 | 7/2006 | Ishii et al. |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,145,805 B2 | 12/2006 | Ishii et al. |
| 7,151,692 B2 | 12/2006 | Wu |
| 7,158,058 B1 | 1/2007 | Yu |
| 7,170,781 B2 | 1/2007 | So et al. |
| 7,170,802 B2 | 1/2007 | Cernea et al. |
| 7,173,859 B2 | 2/2007 | Hemink |
| 7,177,184 B2 | 2/2007 | Chen |
| 7,177,195 B2 | 2/2007 | Gonzales et al. |
| 7,177,199 B2 | 2/2007 | Chen et al. |
| 7,177,200 B2 | 2/2007 | Ronen et al. |
| 7,184,338 B2 | 2/2007 | Nakagawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,644 B1 | 3/2007 | Anderson et al. |
| 7,196,928 B2 | 3/2007 | Chen |
| 7,196,933 B2 | 3/2007 | Shibata |
| 7,197,594 B2 | 3/2007 | Raz et al. |
| 7,200,062 B2 | 4/2007 | Kinsely et al. |
| 7,210,077 B2 | 4/2007 | Brandenberger et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,254,763 B2 | 8/2007 | Aadsen et al. |
| 7,257,027 B2 | 8/2007 | Park |
| 7,259,987 B2 | 8/2007 | Chen et al. |
| 7,266,026 B2 | 9/2007 | Gongwer et al. |
| 7,266,069 B2 | 9/2007 | Chu |
| 7,269,066 B2 | 9/2007 | Nguyen et al. |
| 7,272,757 B2 | 9/2007 | Stocken |
| 7,274,611 B2 | 9/2007 | Roohparvar |
| 7,277,355 B2 | 10/2007 | Tanzawa |
| 7,280,398 B1 | 10/2007 | Lee et al. |
| 7,280,409 B2 | 10/2007 | Misumi et al. |
| 7,280,415 B2 | 10/2007 | Hwang et al. |
| 7,283,399 B2 | 10/2007 | Ishii et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,269 B2 | 12/2007 | Shibata |
| 7,310,271 B2 | 12/2007 | Lee |
| 7,310,272 B1 | 12/2007 | Mokhesi et al. |
| 7,310,347 B2 | 12/2007 | Lasser |
| 7,312,727 B1 | 12/2007 | Feng et al. |
| 7,321,509 B2 | 1/2008 | Chen et al. |
| 7,328,384 B1 | 2/2008 | Kulkarni et al. |
| 7,342,831 B2 | 3/2008 | Mokhlesi et al. |
| 7,343,330 B1 | 3/2008 | Boesjes et al. |
| 7,345,924 B2 | 3/2008 | Nguyen et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,365,671 B1 | 4/2008 | Anderson |
| 7,388,781 B2 | 6/2008 | Litsyn et al. |
| 7,397,697 B2 | 7/2008 | So et al. |
| 7,405,974 B2 | 7/2008 | Yaoi et al. |
| 7,405,979 B2 | 7/2008 | Ishii et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,409,623 B2 | 8/2008 | Baker et al. |
| 7,420,847 B2 | 9/2008 | Li |
| 7,433,231 B2 | 10/2008 | Aritome |
| 7,433,697 B2 | 10/2008 | Karaoguz et al. |
| 7,434,111 B2 | 10/2008 | Sugiura et al. |
| 7,437,498 B2 | 10/2008 | Ronen |
| 7,440,324 B2 | 10/2008 | Mokhlesi |
| 7,440,331 B2 | 10/2008 | Hemink |
| 7,441,067 B2 | 10/2008 | Gorobets et al. |
| 7,447,970 B2 | 11/2008 | Wu et al. |
| 7,450,421 B2 | 11/2008 | Mokhesi et al. |
| 7,453,737 B2 | 11/2008 | Ha |
| 7,457,163 B2 | 11/2008 | Hemink |
| 7,457,897 B1 | 11/2008 | Lee et al. |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 | 12/2008 | Kang et al. |
| 7,468,911 B2 * | 12/2008 | Lutze et al. ............. 365/185.17 |
| 7,469,049 B1 | 12/2008 | Feng |
| 7,471,581 B2 | 12/2008 | Tran et al. |
| 7,483,319 B2 | 1/2009 | Brown |
| 7,487,329 B2 | 2/2009 | Hepkin et al. |
| 7,487,394 B2 | 2/2009 | Forhan et al. |
| 7,492,641 B2 | 2/2009 | Hosono et al. |
| 7,508,710 B2 | 3/2009 | Mokhlesi |
| 7,526,711 B2 | 4/2009 | Orio |
| 7,539,061 B2 | 5/2009 | Lee |
| 7,539,062 B2 | 5/2009 | Doyle |
| 7,551,492 B2 | 6/2009 | Kim |
| 7,558,109 B2 | 7/2009 | Brandman et al. |
| 7,558,839 B1 | 7/2009 | McGovern |
| 7,568,135 B2 | 7/2009 | Cornwell et al. |
| 7,570,520 B2 | 8/2009 | Kamei et al. |
| 7,574,555 B2 | 8/2009 | Porat et al. |
| 7,590,002 B2 | 9/2009 | Mokhlesi et al. |
| 7,593,259 B2 | 9/2009 | Kim |
| 7,594,093 B1 | 9/2009 | Kancherla |
| 7,596,707 B1 | 9/2009 | Vemula |
| 7,609,787 B2 | 10/2009 | Jahan et al. |
| 7,613,043 B2 | 11/2009 | Cornwell et al. |
| 7,616,498 B2 | 11/2009 | Mokhlesi et al. |
| 7,619,918 B2 | 11/2009 | Aritome |
| 7,631,245 B2 | 12/2009 | Lasser |
| 7,633,798 B2 | 12/2009 | Sarin et al. |

| Patent | Date | Inventor |
|---|---|---|
| 7,633,802 B2 | 12/2009 | Mokhlesi |
| 7,639,532 B2 | 12/2009 | Roohparvar et al. |
| 7,644,347 B2 | 1/2010 | Alexander et al. |
| 7,656,734 B2 | 2/2010 | Thorp et al. |
| 7,660,158 B2 | 2/2010 | Aritome |
| 7,660,183 B2 | 2/2010 | Ware et al. |
| 7,661,000 B2 | 2/2010 | Ueda et al. |
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 | 6/2010 | Walston et al. |
| 7,742,351 B2 | 6/2010 | Inoue et al. |
| 7,761,624 B2 | 7/2010 | Karamcheti et al. |
| 7,797,609 B2 | 9/2010 | Neuman |
| 7,810,017 B2 | 10/2010 | Radke |
| 7,848,149 B2 | 12/2010 | Gonzales et al. |
| 7,869,273 B2 | 1/2011 | Lee et al. |
| 7,885,119 B2 | 2/2011 | Li |
| 7,904,783 B2 | 3/2011 | Brandman et al. |
| 7,928,497 B2 | 4/2011 | Yaegashi |
| 7,929,549 B1 | 4/2011 | Talbot |
| 7,930,515 B2 | 4/2011 | Gupta et al. |
| 7,945,825 B2 | 5/2011 | Cohen et al. |
| 7,978,516 B2 | 7/2011 | Olbrich et al. |
| 8,014,094 B1 | 9/2011 | Jin |
| 8,037,380 B2 | 10/2011 | Cagno et al. |
| 8,040,744 B2 | 10/2011 | Gorobets et al. |
| 8,065,583 B2 | 11/2011 | Radke |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Van Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0144361 A1 | 6/2005 | Gonzalez et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0104211 A1 | 5/2007 | Opsasnick |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobets |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0123426 A1* | 5/2008 | Lutze et al. ............. 365/185.17 |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |

| | | | |
|---|---|---|---|
| 2008/0209116 A1 | 8/2008 | Caulkins | |
| 2008/0209304 A1 | 8/2008 | Winarski et al. | |
| 2008/0215798 A1 | 9/2008 | Sharon et al. | |
| 2008/0219050 A1 | 9/2008 | Shalvi et al. | |
| 2008/0239093 A1 | 10/2008 | Easwar et al. | |
| 2008/0239812 A1 | 10/2008 | Abiko et al. | |
| 2008/0253188 A1 | 10/2008 | Aritome | |
| 2008/0263262 A1 | 10/2008 | Sokolov et al. | |
| 2008/0263676 A1 | 10/2008 | Mo et al. | |
| 2008/0270730 A1 | 10/2008 | Lasser et al. | |
| 2008/0282106 A1 | 11/2008 | Shalvi et al. | |
| 2008/0288714 A1 | 11/2008 | Salomon et al. | |
| 2009/0013233 A1 | 1/2009 | Radke | |
| 2009/0024905 A1 | 1/2009 | Shalvi et al. | |
| 2009/0034337 A1 | 2/2009 | Aritome | |
| 2009/0043831 A1 | 2/2009 | Antonopoulos et al. | |
| 2009/0043951 A1 | 2/2009 | Shalvi et al. | |
| 2009/0049234 A1 | 2/2009 | Oh et al. | |
| 2009/0073762 A1 | 3/2009 | Lee et al. | |
| 2009/0086542 A1 | 4/2009 | Lee et al. | |
| 2009/0089484 A1 | 4/2009 | Chu | |
| 2009/0091979 A1 | 4/2009 | Shalvi | |
| 2009/0094930 A1 | 4/2009 | Schwoerer | |
| 2009/0106485 A1 | 4/2009 | Anholt | |
| 2009/0112949 A1 | 4/2009 | Ergan et al. | |
| 2009/0132755 A1 | 5/2009 | Radke | |
| 2009/0144600 A1 | 6/2009 | Perlmutter et al. | |
| 2009/0150894 A1 | 6/2009 | Huang et al. | |
| 2009/0157950 A1 | 6/2009 | Selinger | |
| 2009/0157964 A1 | 6/2009 | Kasorla et al. | |
| 2009/0158126 A1 | 6/2009 | Perlmutter et al. | |
| 2009/0168524 A1 | 7/2009 | Golov et al. | |
| 2009/0172257 A1 | 7/2009 | Prins et al. | |
| 2009/0172261 A1 | 7/2009 | Prins et al. | |
| 2009/0193184 A1 | 7/2009 | Yu et al. | |
| 2009/0199074 A1 | 8/2009 | Sommer et al. | |
| 2009/0204824 A1 | 8/2009 | Lin et al. | |
| 2009/0204872 A1 | 8/2009 | Yu et al. | |
| 2009/0213653 A1 | 8/2009 | Perlmutter et al. | |
| 2009/0213654 A1 | 8/2009 | Perlmutter et al. | |
| 2009/0225595 A1 | 9/2009 | Kim | |
| 2009/0228761 A1 | 9/2009 | Perlmutter et al. | |
| 2009/0240872 A1 | 9/2009 | Perlmutter et al. | |
| 2009/0265509 A1 | 10/2009 | Klein | |
| 2009/0300227 A1 | 12/2009 | Nochimowski et al. | |
| 2009/0323412 A1 | 12/2009 | Mokhlesi et al. | |
| 2009/0327608 A1 | 12/2009 | Eschmann | |
| 2010/0017650 A1 | 1/2010 | Chin et al. | |
| 2010/0034022 A1 | 2/2010 | Dutta et al. | |
| 2010/0057976 A1 | 3/2010 | Lasser | |
| 2010/0061151 A1 | 3/2010 | Miwa et al. | |
| 2010/0082883 A1 | 4/2010 | Chen et al. | |
| 2010/0083247 A1 | 4/2010 | Kanevsky et al. | |
| 2010/0110580 A1 | 5/2010 | Takashima | |
| 2010/0131697 A1 | 5/2010 | Alrod et al. | |
| 2010/0142268 A1 | 6/2010 | Aritome | |
| 2010/0142277 A1 | 6/2010 | Yang et al. | |
| 2010/0169547 A1 | 7/2010 | Ou | |
| 2010/0169743 A1 | 7/2010 | Vogan et al. | |
| 2010/0174847 A1 | 7/2010 | Paley et al. | |
| 2010/0211803 A1 | 8/2010 | Lablans | |
| 2010/0287217 A1 | 11/2010 | Borchers et al. | |
| 2011/0010489 A1 | 1/2011 | Yeh | |
| 2011/0060969 A1 | 3/2011 | Ramamoorthy et al. | |
| 2011/0066793 A1 | 3/2011 | Burd | |
| 2011/0075482 A1 | 3/2011 | Shepard et al. | |
| 2011/0107049 A1 | 5/2011 | Kwon et al. | |
| 2011/0149657 A1 | 6/2011 | Haratsch et al. | |
| 2011/0199823 A1 | 8/2011 | Bar-Or et al. | |
| 2011/0302354 A1 | 12/2011 | Miller | |

FOREIGN PATENT DOCUMENTS

| | | | |
|---|---|---|---|
| EP | 1434236 B1 | 6/2004 | |
| EP | 1605509 A1 | 12/2005 | |
| WO | 9610256 A1 | 4/1996 | |
| WO | 9828745 A1 | 7/1998 | |
| WO | 02100112 A1 | 12/2002 | |
| WO | 03100791 A1 | 12/2003 | |
| WO | 2007046084 A2 | 4/2007 | |
| WO | 2007132452 A | 11/2007 | |
| WO | 2007132453 A2 | 11/2007 | |
| WO | 2007132456 A2 | 11/2007 | |
| WO | 2007132457 A2 | 11/2007 | |
| WO | 2007132458 A2 | 11/2007 | |
| WO | 2007146010 A2 | 12/2007 | |
| WO | 2008026203 A2 | 3/2008 | |
| WO | 2008053472 A2 | 5/2008 | |
| WO | 2008053473 A2 | 5/2008 | |
| WO | 2008068747 A2 | 6/2008 | |
| WO | 2008077284 A1 | 7/2008 | |
| WO | 2008083131 A2 | 7/2008 | |
| WO | 2008099958 A1 | 8/2008 | |
| WO | 2008111058 A2 | 9/2008 | |
| WO | 2008124760 A2 | 10/2008 | |
| WO | 2008139441 A1 | 11/2008 | |
| WO | 2009037691 A2 | 3/2009 | |
| WO | 2009037697 A2 | 3/2009 | |
| WO | 2009038961 A2 | 3/2009 | |
| WO | 2009050703 A2 | 4/2009 | |
| WO | 2009053961 A2 | 4/2009 | |
| WO | 2009053962 A2 | 4/2009 | |
| WO | 2009053963 A2 | 4/2009 | |
| WO | 2009063450 A2 | 5/2009 | |
| WO | 2009072100 A2 | 6/2009 | |
| WO | 2009072101 A2 | 6/2009 | |
| WO | 2009072102 A2 | 6/2009 | |
| WO | 2009072103 A2 | 6/2009 | |
| WO | 2009072104 A2 | 6/2009 | |
| WO | 2009072105 A2 | 6/2009 | |
| WO | 2009074978 A2 | 6/2009 | |
| WO | 2009074979 A2 | 6/2009 | |
| WO | 2009078006 A2 | 6/2009 | |
| WO | 2009095902 A2 | 8/2009 | |
| WO | 2011024015 A1 | 3/2011 | |

OTHER PUBLICATIONS

U.S. Appl. No. 13/114,049 Official Action dated Sep. 12, 2011.
U.S. Appl. No. 12/405,275 Official Action dated Jul. 29, 2011.
Conway et al., "Sphere Packings, Lattices and Groups", 3rd edition, chapter 4, pp. 94-135, Springer, New York, USA 1998.
Chinese Patent Application # 200780040493.X Official Action dated Jun. 15, 2011.
U.S. Appl. No. 12/037,487 Official Action dated Oct. 3, 2011.
U.S. Appl. No. 12/649,360 Official Action dated Aug. 9, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 13/192,495, filed Jul. 28, 2011.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
U.S. Appl. No. 11/945,575 Official Action dated Aug. 24, 2010.
U.S. Appl. No. 12/045,520 Official Action dated Nov. 16, 2010.
U.S. Appl. No. 12/323,544 Office Action dated Dec. 13, 2011.
U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.

US 7,161,836 B2 01/09/2007 Wan et al. (withdrawn).
U.S. Appl. No. 11/995,814 Official Action dated Dec. 17, 2010.
U.S. Appl. No. 12/388,528 Official Action dated Nov. 29, 2010.
U.S. Appl. No. 12/251,471 Official Action dated Jan. 3, 2011.
Engineering Windows 7, "Support and Q&A for Solid-State Drives", e7blog, May 5, 2009.
Micron Technology Inc., "Memory Management in NAND Flash Arrays", Technical Note, year 2005.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Park et al., "Sub-Grouped Superblock Management for High-Performance Flash Storages", IEICE Electronics Express, vol. 6, No. 6, pp. 297-303, Mar. 25, 2009.
"How to Resolve "Bad Super Block: Magic Number Wrong" in BSD", Free Online Articles Director Article Base, posted Sep. 5, 2009.
Ubuntu Forums, "Memory Stick Failed IO Superblock", posted Nov. 11, 2009.
Super User Forums, "SD Card Failure, can't read superblock", posted Aug. 8, 2010.
U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
Agrell et al., "Closest Point Search in Lattices", IEEE Transactions on Information Theory, vol. 48, No. 8, pp. 2201-2214, Aug. 2002.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May 1984, section 3.2, pp. 47-48.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.
Engh et al., "A self adaptive programming method with 5 mV accuracy for multi-level storage in FLASH", pp. 115-118, Proceedings of the IEEE 2002 Custom Integrated Circuits Conference, May 12-15, 2002.
Goodman et al., "On-Chip ECC for Multi-Level Random Access Memories," Proceedings of the IEEE/CAM Information Theory Workshop, Ithaca, USA, Jun. 25-29, 1989.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.
Horstein, "On the Design of Signals for Sequential and Nonsequential Detection Systems with Feedback," IEEE Transactions on Information Theory IT-12:4 (Oct. 1966), pp. 448-455.
Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.
Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.
Lee et al., "Effects of Floating Gate Interference on NAND Flash Memory Cell Operation", IEEE Electron Device Letters, vol. 23, No. 5, pp. 264-266, May 2002.
Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.
Mielke et al., "Recovery Effects in the Distributed Cycling of Flash Memories", IEEE 44th Annual International Reliability Physics Symposium, pp. 29-35, San Jose, USA, Mar. 2006.
ONFI, "Open NAND Flash Interface Specification," revision 1.0, Dec. 28, 2006.
Phison Electronics Corporation, "PS8000 Controller Specification (for SD Card)", revision 1.2, Document No. S-07018, Mar. 28, 2007.
Shalvi, et al., "Signal Codes," Proceedings of the 2003 IEEE Information Theory Workshop (ITW'2003), Paris, France, Mar. 31-Apr. 4, 2003.
Shiozaki, A., "Adaptive Type-II Hybrid Broadcast ARQ System", IEEE Transactions on Communications, vol. 44, Issue 4, pp. 420-422, Apr. 1996.
Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.
St Microelectronics, "Bad Block Management in NAND Flash Memories", Application note AN-1819, Geneva, Switzerland, May 2004.
St Microelectronics, "Wear Leveling in Single Level Cell NAND Flash Memories," Application note AN-1822 Geneva, Switzerland, Feb. 2007.
Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.
Takeuchi et al., "A Multipage Cell Architecture for High-Speed Programming Multilevel NAND Flash Memories", IEEE Journal of Solid State Circuits, vol. 33, No. 8, Aug. 1998.
Wu et al., "eNVy: A non-Volatile, Main Memory Storage System", Proceedings of the 6th International Conference on Architectural support for programming languages and operating systems, pp. 86-87, San Jose, USA, 1994.
International Application PCT/IL2007/000575 Patentability report dated Mar. 26, 2009.
International Application PCT/IL2007/000575 Search Report dated May 30, 2008.
International Application PCT/IL2007/000576 Patentability Report dated Mar. 19, 2009.
International Application PCT/IL2007/000576 Search Report dated Jul. 7, 2008.
International Application PCT/IL2007/000579 Patentability report dated Mar. 10, 2009.
International Application PCT/IL2007/000579 Search report dated Jul. 3, 2008.
International Application PCT/IL2007/000580 Patentability Report dated Mar. 10, 2009.
International Application PCT/IL2007/000580 Search Report dated Sep. 11, 2008.
International Application PCT/IL2007/000581 Patentability Report dated Mar. 26, 2009.
International Application PCT/IL2007/000581 Search Report dated Aug. 25, 2008.
International Application PCT/IL2007/001059 Patentability report dated Apr. 19, 2009.
International Application PCT/IL2007/001059 Search report dated Aug. 7, 2008.
International Application PCT/IL2007/001315 search report dated Aug. 7, 2008.

International Application PCT/IL2007/001315 Patentability Report dated May 5, 2009.
International Application PCT/IL2007/001316 Search report dated Jul. 22, 2008.
International Application PCT/IL2007/001316 Patentability Report dated May 5, 2009.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
U.S. Appl. No. 11/949,135 Official Action dated Oct. 2, 2009.
U.S. Appl. No. 12/019,011 Official Action dated Nov. 20, 2009.
Sommer, N., U.S. Appl. No. 12/171,797 "Memory Device with Non-Uniform Programming Levels" filed Jul. 11, 2008.
Shalvi et al., U.S. Appl. No. 12/251,471 "Compensation for Voltage Drifts in Analog Memory Cells" filed Oct. 15, 2008.
Sommer et al., U.S. Appl. No. 12/497,707 Data Storage in Analog Memory Cells with Protection Against Programming Interruption filed Jul. 6, 2009.
Winter et al., U.S. Appl. No. 12/534,893 "Improved Data Storage in Analog Memory Cells Using Modified Pass Voltages" filed Aug. 4, 2009.
Winter et al., U.S. Appl. No. 12/534,898 "Data Storage Using Modified Voltages" filed on Aug. 4, 2009.
Shalvi et al., U.S. Appl. No. 12/551,583 "Segmented Data Storage" filed Sep. 1, 2009.
Shalvi et al., U.S. Appl. No. 12/551,567 "Reliable Data Storage in Analog Memory Cells Subjected to Long Retention Periods" filed Sep. 1, 2009.
Perlmutter et al., U.S. Appl. No. 12/558,528 "Estimation of Memory Cell Read Thresholds by Sampling Inside Programming Level Distribution Intervals" filed Sep. 13, 2009.
Sokolov, D., U.S. Appl. No. 12/579,430 "Efficient Programming of Analog Memory Cell Devices" filed Oct. 15, 2009.
Shalvi, O., U.S. Appl. No. 12/579,432 "Efficient Data Storage in Storage Device Arrays" filed Oct. 15, 2009.
Sommer et al., U.S. Appl. No. 12/607,078 "Data Scrambling in Memory Devices" filed Oct. 28, 2009.
Sommer et al., U.S. Appl. No. 12/607,085 "Data Scrambling Schemes for Memory Devices" filed Oct. 28, 2009.
Shalvi et al., U.S. Appl. No. 12/618,732 "Storage at M Bits/Cell Density in N Bits/Cell Analog Memory Cell Devices, M>N" filed Nov. 15, 2009.
Sommer et al., U.S. Appl. No. 12/649,358 "Efficient Readout Schemes for Analog Memory Cell Devices" filed Dec. 30, 2009.
Sommer et al., U.S. Appl. No. 12/649,360 "Efficient Readout Schemes for Analog Memory Cell Devices Using Multiple Read Threshold Sets" filed Dec. 30, 2009.
Rotbard et al., U.S. Appl. No. 12/649,382 "Rejuvenation of Analog Memory Cells" filed Dec. 30, 2009.
Shachar et al., U.S. Appl. No. 12/688,883 "Hierarchical data storage system" filed Jan. 17, 2010.
Jedec Standard JESD84-C44, "Embedded MultiMediaCard (e•MMC) Mechanical Standard, with Optional Reset Signal", Jedec Solid State Technology Association, USA, Jul. 2009.
Jedec, "UFS Specification", version 0.1, Nov. 11, 2009.
Compaq et al., "Universal Serial Bus Specification", revision 2.0, Apr. 27, 2000.
SD Group & SD Card Association, "SD Specifications Part 1 Physical Layer Specification", version 3.01, draft 1.00, Nov. 9, 2009.
Serial ATA International Organization, "Serial ATA Revision 3.0 Specification", Jun. 2, 2009.

Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
Shalvi, O., U.S. Appl. No. 12/758,044 "Memory device with negative thresholds" filed Apr. 12, 2010.
Sokolov et al., U.S. Appl. No. 12/714,501 "Selective Activation of Programming Schemes in Analog Memory Cell Arrays" filed Feb. 28, 2010.
Sokolov et al., U.S. Appl. No. 12/728,287 "Use of host system resources by memory controller" filed Mar. 22, 2010.
Sommer et al., U.S. Appl. No. 12/728,296 "Database of Memory Read Thresholds" filed Mar. 22, 2010.
Sommer et al., U.S. Appl. No. 12/758,003 "Selective re-programming of analog memory cells" filed Apr. 11, 2010.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
U.S. Appl. No. 12/344,233 Official Action dated Jun. 24, 2011.
U.S. Appl. No. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
CN Patent Application No. 200780026181.3 Official Action dated Apr. 8, 2011.
Huffman, A., "Non-Volatile Memory Host Controller Interface (NVMHCI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. No. 12/822,207 "Adaptive Over-Provisioning in Memory Systems" filed Jun. 24, 2010.
U.S. Appl. 12/534,898 Official Action dated Mar. 23, 2011.
U.S. Appl. 13/047,822, filed Mar. 15, 2011.
U.S. Appl. No. 13/069,406, filed Mar. 23, 2011.
U.S. Appl. No. 13/088,361, filed Apr. 17, 2011.
U.S. Appl. No. 12/880,101 "Reuse of Host Hibernation Storage Space by Memory Controller", filed Sep. 12, 2010.
U.S. Appl. No. 12/890,724 "Error Correction Coding Over Multiple Memory Pages", filed Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.
Numonyx, "M25PE16: 16-Mbit, page-erasable serial flash memory with byte-alterability, 75 MHz SPI bus, standard pinout", Apr. 2008.
U.S. Appl. No. 12/323,544 Official Action dated Mar. 9, 2012.
Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", Systor—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model-5 (SAM-5)", INCITS document T10/2104-D, revision 01, Jan. 28, 2009.
SAS Protocol, "Information Technology—Serial Attached SCSI-2 (SAS-2)", INCITS document T10/1760-D, revision 15a, Feb. 22, 2009.

* cited by examiner

SELECTIVE ACTIVATION OF PROGRAMMING SCHEMES IN ANALOG MEMORY CELL ARRAYS

CROSS-REFERENCE TO RELATED APPLICATIONS

This application claims the benefit of U.S. Provisional Patent Application 61/156,520, filed Mar. 1, 2009, whose disclosure is incorporated herein by reference.

FIELD OF THE INVENTION

The present invention relates generally to memory devices, and particularly to methods and systems for programming analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

SUMMARY OF THE INVENTION

An embodiment of the present invention provides a method for data storage, including:

defining a first programming scheme that programs a group of analog memory cells while reducing interference caused by at least one memory cell that neighbors the group, and a second programming scheme that programs the group of the analog memory cells and does not reduce all of the interference reduced by the first programming scheme;

selecting one of the first and second programming schemes based on a criterion defined with respect to the analog memory cells; and storing data in the group of the analog memory cells using the selected programming scheme.

In some embodiments, upon selecting the first programming scheme, storing the data includes initially programming the group so as to store given data, programming the at least one memory cell that neighbors the group after initially programming the group, and re-programming the group with the given data after programming the at least one memory cell that neighbors the group. In an embodiment, upon selecting the second programming scheme, storing the data includes programming the group with the given data only once.

In a disclosed embodiment, upon selecting the first programming scheme, storing the data includes pre-compensating respective storage values for storage in the memory cells in the group responsively to the at least one memory cell that neighbors the group, and writing the pre-compensated storage values into the respective memory cells in the group. In an embodiment, upon selecting the second programming scheme, storing the data includes writing the storage values into the respective memory cells in the group without pre-compensation.

In some embodiments, the criterion depends on a wear level of the memory cells in the group, on a number of Programming and Erasure (P/E) cycles previously applied to the memory cells in the group, on a number of read errors occurring in one or more read operations from the memory cells in the group, on a temperature of the memory cells in the group, on a supply voltage provided to the memory cells in the group, on a retention time that is expected to occur in the memory cells in the group, and/or on a level of the interference affecting the memory cells in the group.

In an embodiment, selecting the one of the programming schemes includes selecting the second programming scheme at a first time, and switching to the first programming scheme at a second time that is later than the first time. In a disclosed embodiment, the method includes switching from the first programming scheme to the second programming scheme at a third time that is later than the second time. In an embodiment, the memory cells are included in a memory device, and selection of the one of the programming schemes is performed by a memory controller that is separate from the memory device and connected to the memory device by an interface. In another embodiment, the memory cells are included in a memory device, and selection of the one of the programming schemes is performed by programming circuitry in the memory device. In yet another embodiment, the memory cells are included in a memory device that is connected to a memory controller by an interface, and the method includes indicating the selected programming scheme over the interface.

There is additionally provided, in accordance with an embodiment of the present invention, a method for data storage, including:

defining a first programming scheme that programs a group of analog memory cells while consuming a first peak power, and a second programming scheme that programs the group of the analog memory cells while consuming a second peak power, lower than the first peak power;

selecting one of the first and second programming schemes based on a criterion defined with respect to the analog memory cells; and storing data in the group of the analog memory cells using the selected programming scheme.

In some embodiments, the first programming scheme programs the group of the memory cells at a first programming speed, and the second programming scheme programs the group of the memory cells at a second programming speed, slower than the first programming speed. In an embodiment, the criterion depends on a number of sets of the memory cells that are programmed concurrently.

There is also provided, in accordance with an embodiment of the present invention, a method for data storage, including:

defining a first programming scheme that programs a group of analog memory cells while permitting immediate aborting of programming the memory cells, and a second programming scheme that programs the group of the analog memory cells without permitting the immediate aborting;

selecting one of the first and second programming schemes based on a criterion defined with respect to the analog memory cells; and storing data in the group of the analog memory cells using the selected programming scheme.

In an embodiment, selecting the one of the programming schemes includes selecting the first programming scheme for programming the group while concurrently reading from another group of the memory cells, and selecting the second programming scheme for programming the group without concurrently reading from any other group of the memory cells.

There is further provided, in accordance with an embodiment of the present invention, apparatus for data storage, including:

a memory, including a plurality of analog memory cells; and circuitry, which is configured to define a first programming scheme that programs a group of the analog memory cells while reducing interference caused by at least one memory cell that neighbors the group, to define a second programming scheme that programs the group of the analog memory cells and does not reduce all of the interference reduced by the first programming scheme, to select one of the first and second programming schemes based on a criterion defined with respect to the analog memory cells, and to store data in the group of the analog memory cells using the selected programming scheme.

There is additionally provided, in accordance with an embodiment of the present invention, apparatus for data storage, including:

a memory, including a plurality of analog memory cells; and circuitry, which is configured to define a first programming scheme that programs a group of the analog memory cells while consuming a first peak power, to define a second programming scheme that programs the group of the analog memory cells while consuming a second peak power, lower than the first peak power, to select one of the first and second programming schemes based on a criterion defined with respect to the analog memory cells, and to store data in the group of the analog memory cells using the selected programming scheme.

There is additionally provided, in accordance with an embodiment of the present invention, apparatus for data storage, including:

a memory, including a plurality of analog memory cells; and circuitry, which is configured to define a first programming scheme that programs a group of the analog memory cells while permitting immediate aborting of programming the memory cells, to define a second programming scheme that programs the group of the analog memory cells without permitting the immediate aborting, to select one of the first and second programming schemes based on a criterion defined with respect to the analog memory cells, and to store data in the group of the analog memory cells using the selected programming scheme.

There is also provided, in accordance with an embodiment of the present invention, apparatus for data storage, including:

an interface, which is configured to communicate with a memory that includes a plurality of analog memory cells; and circuitry, which is configured to define a first programming scheme that programs a group of the analog memory cells while reducing interference caused by at least one memory cell that neighbors the group, to define a second programming scheme that programs the group of the analog memory cells and does not reduce all of the interference reduced by the first programming scheme, to select one of the first and second programming schemes based on a criterion defined with respect to the analog memory cells, and to store data in the group of the analog memory cells using the selected programming scheme.

There is further provided, in accordance with an embodiment of the present invention, apparatus for data storage, including:

an interface, which is configured to communicate with a memory that includes a plurality of analog memory cells; and circuitry, which is configured to define a first programming scheme that programs a group of the analog memory cells while consuming a first peak power, to define a second programming scheme that programs the group of the analog memory cells while consuming a second peak power, lower than the first peak power, to select one of the first and second programming schemes based on a criterion defined with respect to the analog memory cells, and to store data in the group of the analog memory cells using the selected programming scheme.

There is additionally provided, in accordance with an embodiment of the present invention, apparatus for data storage, including:

an interface, which is configured to communicate with a memory that includes a plurality of analog memory cells; and circuitry, which is configured to define a first programming scheme that programs a group of the analog memory cells while permitting immediate aborting of programming the memory cells, to define a second programming scheme that programs the group of the analog memory cells without permitting the immediate aborting, to select one of the first and second programming schemes based on a criterion defined with respect to the analog memory cells, and to store data in the group of the analog memory cells using the selected programming scheme.

The present invention will be more fully understood from the following detailed description of the embodiments thereof, taken together with the drawings in which:

DETAILED DESCRIPTION OF EMBODIMENTS

Overview

Figure 1:
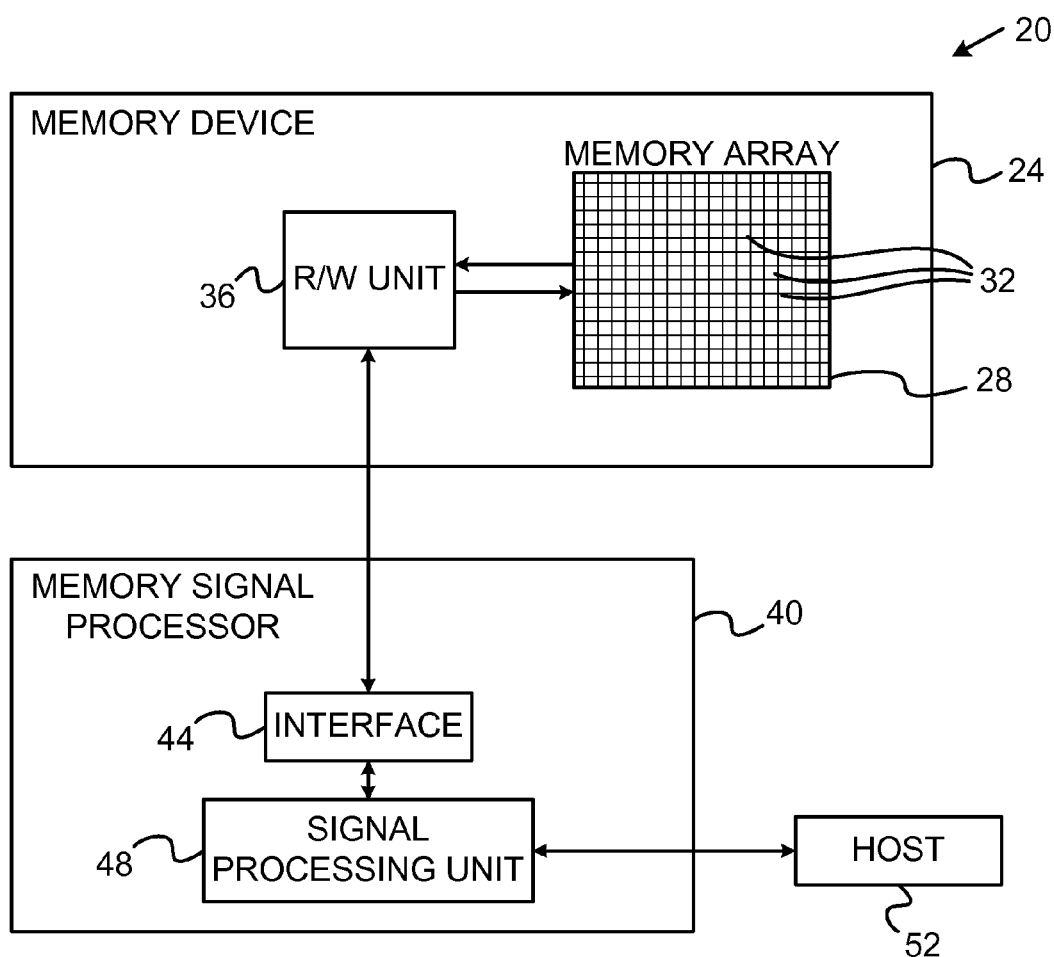
FIG. 1 is a block diagram that schematically illustrates a memory system, in accordance with an embodiment of the present invention.

Embodiments of the present invention that are described hereinbelow provide improved methods and systems for programming analog memory cells. In some embodiments, a memory system comprises a memory that includes multiple analog memory cells, and circuitry that stores data in the memory cells. The circuitry can store data in a given group of memory cells using one of two possible programming schemes. The first programming scheme stores data in the group while reducing interference from neighboring memory cells. The second programming scheme stores data in the group but does not reduce all of the interference that is reduced by the first programming scheme. On the other hand, the second programming scheme is typically faster than the first scheme. When preparing to program a given group of memory cells, the circuitry selects which of the programming schemes to use by evaluating a switching criterion defined with respect to the memory cells in the group.

Several example programming schemes and switching criteria are described herein. In some embodiments, one programming scheme applies re-programming whereas the other programming scheme does not. In the re-programming scheme, the circuitry initially programs the group of memory cells with certain data, and then, after programming at least one of the neighboring memory cells, it goes back and re-programs the group of memory cells with the same data. In alternative embodiments, one programming scheme pre-compensates the storage values written into the group of memory cells for the expected interference from neighboring memory cells. The other programming scheme does not apply pre-compensation.

Programming schemes that reduce less interference from neighboring memory cells are typically fast, but may not reach acceptable storage reliability under some circumstances. Programming schemes that reduce more interference are often slower, but on the other hand provide superior storage reliability under difficult conditions. The flexibility to choose between such programming schemes enables the system to match the programming scheme to the actual conditions of the memory cell group in question and thus to seek an optimal tradeoff between speed and reliability.

Typically, although not necessarily, the switching criterion assesses the wear level or health level of the memory cells in the group. Using this sort of criterion, fresh memory cells are programmed with little or no interference cancellation, at high speed and with little or no effect on storage reliability. Old or heavily-cycled memory cells are programmed with a scheme that cancels interference to a higher degree, so as to achieve acceptable storage reliability at the expense of reduced programming speed.

Additional examples of programming schemes that can be selected by the memory system are described herein. For example, the system can select between a programming scheme that is relatively fast but consumes a relatively high peak power, and a slower programming scheme whose peak power consumption is lower. As another example, the system can select between a programming scheme that permits immediate aborting of the programming operation, and a programming scheme that does not permit immediate aborting. Example switching criteria for these schemes are also described.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 encodes the data for storage using a suitable Error Correction Code (ECC) and decodes the ECC of data retrieved from the memory. In some embodiments, unit 48 produces the storage values for storing in the memory cells and provides these values to R/W unit 36. Alternatively, unit 48 provides the data for storage, and the conversion to storage values is carried out by the R/W unit internally to the memory device. Alternatively to using an MSP, the methods described herein can be carried out by any suitable type of memory controller.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and the MSP may be integrated on separate semiconductor dies in a single Multi-Chip Package (MCP) or System on Chip (SoC), and may be interconnected by an internal bus. Further alternatively, some or all of the MSP circuitry may reside on the same die on which the memory array is disposed. Further alternatively, some or all of the functionality of MSP 40 can be implemented in software and carried out by a processor or other element of the host system. In some embodiments, host 44 and MSP 40 may be fabricated on the same die, or on separate dies in the same device package.

In some embodiments, MSP 40 (or other memory controller that carries out the methods described herein) comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several tens of thousands of cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used. Some memory devices comprise two or more separate memory cell arrays, often referred to as planes. Since each plane has a certain "busy" period between successive write operations, data can be written alternately to the different planes in order to increase programming speed.

In some embodiments, R/W unit 36 programs memory cells 32 using an iterative Program and Verify (P&V) process. In a typical P&V process, an entire group of memory cells (e.g., a memory page) is programmed by applying a sequence of programming pulses to the memory cells in the group. The storage values programmed in the cells are read ("verified") after each pulse, and the iterations continue selectively only for memory cells that have not yet reached the desired levels.

Modifying the Programming Scheme at Different Memory Cell Life-Cycle Stages

System 20 can program memory cells 32 using various programming schemes. In particular, when programming a given group of memory cells, different programming schemes may reach different levels of interference cancellation. Programming schemes that cancel more interference from neighboring memory cells are typically more accurate and provide improved resilience to interference. On the other hand, these schemes may be slower and involve more computational complexity. Programming schemes that cancel less interference may be relatively fast, but on the other hand they may be less accurate and more sensitive to interference.

In some embodiments, system 20 selects the programming scheme for programming a given group of memory cells 32 by evaluating a switching criterion that is defined with respect to the memory cells. In particular, system 20 may select between a first programming scheme that programs the memory cells while reducing interference from neighboring memory cells, and a second programming scheme that programs the memory cells but does not reduce all the interference reduced by the first programming scheme.

The term "neighboring memory cell" refers to any memory cell that potentially causes interference to one or more of the memory cells in the given group of memory cells. Typically, although not necessarily, neighboring memory cells are physically adjacent to the memory cells in the given group, e.g., in adjacent rows or columns of array 28. In some embodiments, memory cells that are physically distant from the given group of memory cells, but still cause interference to the group, may also be regarded as neighbors. On the other hand, memory cells that are programmed concurrently with the given group of memory cells (e.g., memory cells belonging to the same page, or memory cells that are programmed in the same P&V programming sequence as the given group) are not considered neighbors.

For example, system 20 may select between a programming scheme that uses re-programming and a programming scheme that does not use re-programming. A re-programming scheme initially programs certain data in a first group of memory cells, then programs a second group of neighboring memory cells that potentially cause interference to the first group, and then returns and re-programs the first group with the same data as in the initial programming. The re-programming operation ensures that each group of memory cells is programmed after the neighboring memory cells (which potentially cause interference) are already programmed. When the programming operations are performed using a closed-loop P&V process, interference from memory cells that were previously programmed is inherently compensated for. On the other hand, re-programming schemes typically reduce the programming speed, because they involve a higher number of write operations.

Note that the term "re-programming scheme" refers to a programming scheme that writes the same data to a group of memory cells (e.g., programs a given memory page) more than once. Programming schemes that store data alternately in groups of memory cells but store different data at each write operation (e.g., program different MLC bits in the same group of memory cells) are not considered re-programming schemes in the present context.

In some embodiments, system 20 defines a first programming scheme that does not use re-programming, and a second programming scheme that does apply re-programming. Initially, the system programs groups of memory cells using the first programming scheme. When a certain switching criterion with respect to the memory cells is met, the system reverts to program the memory cells using the second programming scheme.

System 20 may use various switching criteria for selecting between the two programming schemes. In some embodiments, the switching criterion assesses the wear level or health level of the memory cells in the group. For example, the criterion may specify switching from the first programming scheme to the second programming scheme when the memory cells in the group exceed a predefined number of Programming and Erasure (P/E) cycles. In other words, the system will program the memory cells without re-programming below a certain number of P/E cycles, and revert to applying re-programming when the predefined number of P/E cycles is exceeded.

As another example, the switching criterion may consider the number of read errors that were encountered in reading the group of memory cells in the last read operation, or in the last several read operations. Below a certain number of read errors, the system may continue to program the memory cells without re-programming. When the number of read errors exceeds a certain value, the system begins to apply re-programming in subsequent programming operations.

When using the example switching criteria described above, the system selects a programming scheme that matches the actual wear level or health level of the memory cells. When the memory cells are relatively fresh and healthy, they can be programmed at high speed with little or no interference cancellation, and with little or no effect on storage reliability. At a later stage in the cells' life cycle, re-programming (or other interference cancellation scheme) may be needed to achieve reliable storage.

Typically, although not necessarily, the system uses the faster programming scheme in the early life cycle stages of the memory cells, and switches to the slower but more robust programming scheme later in the memory cells' life cycle. Alternatively, however, any other suitable switching criterion can also be used. For example, the switching criterion may depend on the level of distortion (e.g., cross-coupling interference from neighboring memory cells) that affects the group of memory cells. When the distortion level is low, the system may program the memory cells without re-programming. When the distortion is high, the system may begin to apply re-programming in order to improve the programming accuracy and reduce the distortion.

As another example, switching between programming schemes can be performed as a function of the memory device temperature. Another example switching criterion depends on the supply voltage (Vcc) that provides electrical power to the group of memory cells. For example, a NAND Flash device may operate with a supply voltage around 3.3V or around 1.8V. In some embodiments, the system may select a given programming scheme when the supply voltage is around 3.3V, and another programming scheme when the supply voltage is around 1.8V.

As yet another example, the switching criterion may depend on the expected retention time of the cell group in question, i.e., on the time period that is expected to elapse from programming until the memory cells are read or refreshed. When the expected retention time is relatively short, the system may use a programming scheme that does not apply re-programming. When the expected retention time is long or unknown, the system may choose to apply re-programming in order to maintain storage reliably during the retention period. In an example embodiment, system 20 is used in a computer that supports a hibernation state, e.g., in a SSD. When the computer is preparing to enter the hibernation state, it stores various kinds of data in a hibernation file that is used for restoring the computer state and applications when resuming operation. In most practical cases, the hibernation period does not exceed a certain known length, e.g., one month. Therefore, system 20 may store the hibernation file using a relatively fast programming scheme without re-programming. Other data can be stored with re-programming.

In some of the above-mentioned examples, as well as in other possible switching criteria, the system may alternate between the two programming schemes more than once, as appropriate. In some embodiments, the switching condition also depends on the identity of the group of memory cells or its location in the memory. For example, a switching criterion may specify the following: When the number of P/E cycles exceeds 1000, switch to the second programming scheme only for word lines 1-10; when the number of P/E cycles exceeds 2000, switch to the second programming scheme for word lines 1-30; and when the number of P/E cycles exceeds 3000, switch to the second programming scheme only for all word lines. Any other suitable switching criterion that depends on the identity or location of the cell group in the memory can also be used.

In alternative embodiments, system 20 defines a first programming scheme that pre-compensates for the expected interference from the neighboring memory cells, and a second programming scheme that does not perform pre-compensation. The system then selects between the two programming schemes using a certain switching criterion. Any of the switching criteria described above, or any other suitable switching criterion, can be used for this purpose.

When preparing to program a given group of memory cells, system 20 may pre-compensate for the expected interference in various ways. For example, the system may read the data or storage values from the neighboring memory cells and calculate corrections that, if applied to the storage values written into the memory cells in the group will cancel the expected interference. The system can then apply the corrections, and write the pre-corrected storage values into the memory cells in the group. In alternative embodiments, the system may estimate the expected interference without reading the neighboring memory cells. For example, when the data that was written into the neighboring cells is still cached in the MSP or in the memory device, the system may calculate the corrections based on the cached data.

In some embodiments, system 20 may combine the two above-mentioned techniques, i.e., define a first programming scheme that uses re-programming and pre-compensation, and a second programming scheme that does not use re-programming or pre-compensation. Additionally or alternatively, the system may define and select between any other suitable programming schemes. In some embodiments, the system may switch among more than two programming schemes using suitable switching criteria. For example, one programming scheme may apply no re-programming and no interference pre-compensation, a second programming scheme may apply re-programming but no interference pre-compensation, and a third programming scheme may apply both re-programming and interference pre-compensation.

Figure 2:
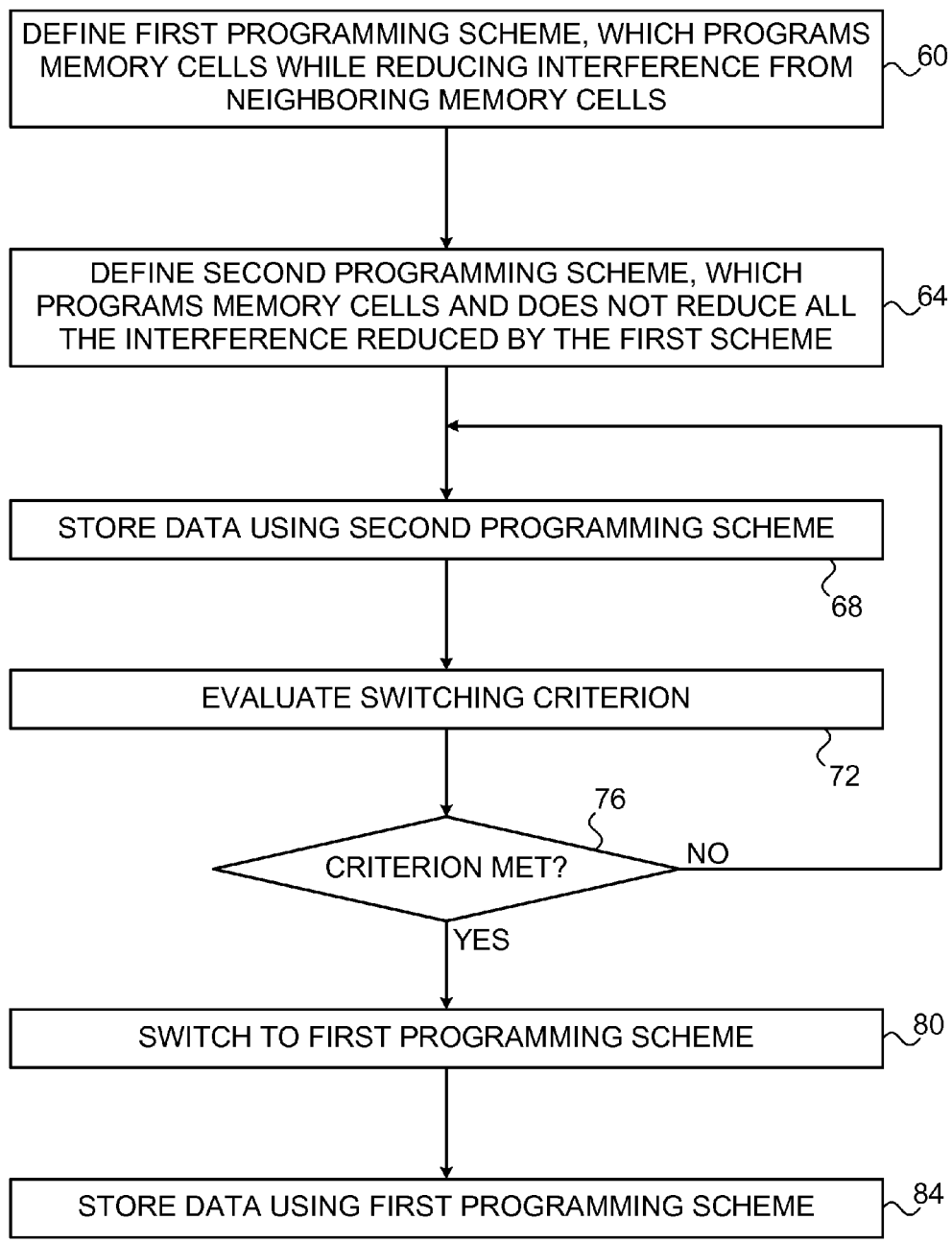
FIG. 2 is a flow chart that schematically illustrates a method for programming analog memory cells, in accordance with an embodiment of the present invention.

FIG. 2 is a flow chart that schematically illustrates a method for programming analog memory cells, in accordance with an embodiment of the present invention. The method begins with system 20 defining a first programming scheme that programs a group of memory cells while reducing interference from at least one neighboring memory cells, at a first definition step 60. The system further defines a second programming scheme, which programs the group of memory cells but does not cancel all the interference that is canceled by the first scheme, at a second definition step 64.

For a given group of memory cells, system 20 initially stores data received from host 52 using the second programming scheme, at an initial storage step 68. The system evaluates a predefined switching criterion, at a criterion evaluation step 72. If the switching criterion is not met, as checked at a checking step 76, the method loops back to step 68 above. Otherwise, i.e., if the switching criterion is met, system 20 switches to the first programming scheme, at a switching step 80. The system continues to store data in the given group of memory cells using the first programming scheme, at a subsequent storage step 84.

In some embodiments, evaluation of the switching criterion and selection of the appropriate programming scheme are carried out by MSP 48, e.g., by unit 48. In alternative embodiments, switching criterion evaluation and programming scheme selection are carried out by R/W unit 36 in memory device 24. Further alternatively, these functions can be partitioned between the MSP and the memory device in any desired fashion. In an example embodiment, MSP 40 selects the appropriate programming scheme, and notifies R/W unit 36 of the selected scheme. The R/W unit applies the selected programming scheme in response to the notification from the MSP. In another embodiment, the R/W unit selects the programming scheme and reports the selected scheme to the MSP. The MSP and memory device may support a suitable command or signal interface for exchanging these notifications. In the present context, MSP 40 and R/W unit 36 are regarded as circuitry, which evaluates the switching criterion and selects the programming scheme accordingly.

Evaluation of the switching condition and selection of the programming scheme can be performed for different groups of memory cells, e.g., per page or set of pages, per sector or set of sectors, per word line or set of word lines, per erasure block or set of blocks, per memory plane, per memory device in a multi-device system, per semiconductor die in a multi-die device, or at any other suitable granularity.

Additional Example Programming Schemes

In alternative embodiments, system 20 may define and select between other kinds of programming schemes using suitable switching criteria. For example, in some practical cases the peak power consumed by system 20 is limited. In some embodiments, system 20 defines one programming scheme that is relatively fast but consumes a relatively high peak power, and another programming scheme that is slower but has lower peak power consumption. For example, one programming scheme may program all the memory cells in a given word line concurrently using a P&V process. The other programming scheme may divide the cells of the word line into subsets, and program one subset at a time using P&V. Programming one subset at a time reduces the peak power consumption of the programming operation, at the expense of reducing the programming speed. Alternatively, any other suitable programming scheme having lower peak power consumption can be used.

System 20 may select between the two programming schemes using various switching criteria. For example, the switching criterion may depend on the number of sets of memory cells (e.g., number of dies or memory planes) that are programmed concurrently. In an example embodiment, when the programming operation programs multiple sets of memory cells concurrently (e.g., a command that programs multiple dies simultaneously), the peak power is expected to be high. In these scenarios, the system may select a slower programming scheme that draws less peak power. When programming a single set of memory cells (e.g., a single die), or a small number of sets, the faster and higher-power programming scheme may still meet the peak power limit of the system.

As another example, system 20 may define one programming scheme that permits immediate aborting before completion of the programming operation, and another programming scheme that does not permit premature aborting of the programming. When defining a P&V operation, immediate aborting can be enabled, for example, by having the memory device check after each P&V iteration whether an abort instruction was given by the MSP. Typically, a programming scheme that permits immediate aborting is slower, but may be preferable under certain circumstances. For example, when the programming operation is carried out in parallel to reading from another group of memory cells (e.g., during copy-back or read-while-write operations), it may be preferable for the MSP to abort the programming operation in order to enable readout.

In the description above, some switching criteria were described in the context of specific programming schemes. This choice, however, was made purely for the sake of conceptual clarity. Generally, any of the switching criteria defined herein can be used to select between any of the disclosed programming schemes.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
 defining a first programming scheme that programs a group of analog memory cells while reducing interference caused by at least one memory cell that neighbors the group, and a second programming scheme that programs the group of the analog memory cells and does not reduce all of the interference reduced by the first programming scheme;

selecting one of the first and second programming schemes based on a criterion defined with respect to the analog memory cells; and storing data in the group of the analog memory cells using the selected programming scheme.

2. The method according to claim 1, wherein, upon selecting the first programming scheme, storing the data comprises initially programming the group so as to store given data, programming the at least one memory cell that neighbors the group after initially programming the group, and re-programming the group with the given data after programming the at least one memory cell that neighbors the group.

3. The method according to claim 2, wherein, upon selecting the second programming scheme, storing the data comprises programming the group with the given data only once.

4. The method according to claim 1, wherein, upon selecting the first programming scheme, storing the data comprises pre-compensating respective storage values for storage in the memory cells in the group responsively to the at least one memory cell that neighbors the group, and writing the pre-compensated storage values into the respective memory cells in the group.

5. The method according to claim 4, wherein, upon selecting the second programming scheme, storing the data comprises writing the storage values into the respective memory cells in the group without pre-compensation.

6. The method according to claim 1, wherein the criterion depends on a wear level of the memory cells in the group.

7. The method according to claim 1, wherein the criterion depends on a number of Programming and Erasure (P/E) cycles previously applied to the memory cells in the group.

8. The method according to claim 1, wherein the criterion depends on a number of read errors occurring in one or more read operations from the memory cells in the group.

9. The method according to claim 1, wherein the criterion depends on a temperature of the memory cells in the group.

10. The method according to claim 1, wherein the criterion depends on a supply voltage provided to the memory cells in the group.

11. The method according to claim 1, wherein the criterion depends on a retention time that is expected to occur in the memory cells in the group.

12. The method according to claim 1, wherein the criterion depends on a level of the interference affecting the memory cells in the group.

13. The method according to claim 1, wherein selecting the one of the programming schemes comprises selecting the second programming scheme at a first time, and switching to the first programming scheme at a second time that is later than the first time.

14. The method according to claim 13, and comprising switching from the first programming scheme to the second programming scheme at a third time that is later than the second time.

15. The method according to claim 1, wherein the memory cells are comprised in a memory device, and wherein selection of the one of the programming schemes is performed by a memory controller that is separate from the memory device and connected to the memory device by an interface.

16. The method according to claim 1, wherein the memory cells are comprised in a memory device, and wherein selection of the one of the programming schemes is performed by programming circuitry in the memory device.

17. The method according to claim 1, wherein the memory cells are comprised in a memory device that is connected to a memory controller by an interface, and comprising indicating the selected programming scheme over the interface.

18. Apparatus for data storage, comprising:
a memory, comprising a plurality of analog memory cells; and
circuitry, which is configured to define a first programming scheme that programs a group of the analog memory cells while reducing interference caused by at least one memory cell that neighbors the group, to define a second programming scheme that programs the group of the analog memory cells and does not reduce all of the interference reduced by the first programming scheme, to select one of the first and second programming schemes based on a criterion defined with respect to the analog memory cells, and to store data in the group of the analog memory cells using the selected programming scheme.

19. The apparatus according to claim 18, wherein, upon selecting the first programming scheme, the circuitry is configured to initially program the group so as to store given data, to program the at least one memory cell that neighbors the group after initially programming the group, and to re-program the group with the given data after programming the at least one memory cell that neighbors the group.

20. The apparatus according to claim 19, wherein, upon selecting the second programming scheme, the circuitry is configured to program the group with the given data only once.

21. The apparatus according to claim 18, wherein, upon selecting the first programming scheme, the circuitry is configured to pre-compensate respective storage values for storage in the memory cells in the group responsively to the at least one memory cell that neighbors the group, and to write the pre-compensated storage values into the respective memory cells in the group.

22. The apparatus according to claim 21, wherein, upon selecting the second programming scheme, the circuitry is configured to write the storage values into the respective memory cells in the group without pre-compensation.

23. The apparatus according to claim 18, wherein the criterion depends on a wear level of the memory cells in the group.

24. The apparatus according to claim 18, wherein the criterion depends on a number of Programming and Erasure (P/E) cycles previously applied to the memory cells in the group.

25. The apparatus according to claim 18, wherein the criterion depends on a number of read errors occurring in one or more read operations from the memory cells in the group.

26. The apparatus according to claim 18, wherein the criterion depends on a temperature of the memory cells in the group.

27. The apparatus according to claim 18, wherein the criterion depends on a supply voltage provided to the memory cells in the group.

28. The apparatus according to claim 18, wherein the criterion depends on a retention time that is expected to occur in the memory cells in the group.

29. The apparatus according to claim 18, wherein the criterion depends on a level of the interference affecting the memory cells in the group.

30. The apparatus according to claim 18, wherein the circuitry is configured to select the second programming scheme at a first time, and to switch to the first programming scheme at a second time that is later than the first time.

31. The apparatus according to claim 30, wherein the circuitry is configured to switch from the first programming scheme to the second programming scheme at a third time that is later than the second time.

32. The apparatus according to claim 18, wherein the circuitry comprises programming circuitry that is coupled to the memory cells and a memory controller that is separate from the programming circuitry and connected to the programming circuitry by an interface, and wherein selection of the one of the programming schemes is performed by the memory controller.

33. The apparatus according to claim 18, wherein the circuitry comprises programming circuitry that is coupled to the memory cells and a memory controller that is separate from the programming circuitry and connected to the programming circuitry by an interface, and wherein selection of the one of the programming schemes is performed by the programming circuitry.

34. The apparatus according to claim 18, wherein the circuitry comprises programming circuitry that is coupled to the memory cells and a memory controller that is separate from the programming circuitry and connected to the programming circuitry by an interface, and comprising indicating the selected programming scheme over the interface.

35. Apparatus for data storage, comprising:

an interface, which is configured to communicate with a memory that includes a plurality of analog memory cells; and circuitry, which is configured to define a first programming scheme that programs a group of the analog memory cells while reducing interference caused by at least one memory cell that neighbors the group, to define a second programming scheme that programs the group of the analog memory cells and does not reduce all of the interference reduced by the first programming scheme, to select one of the first and second programming schemes based on a criterion defined with respect to the analog memory cells, and to store data in the group of the analog memory cells using the selected programming scheme.

* * * * *